United States Patent [19]

Maus et al.

[11] Patent Number: 4,696,835
[45] Date of Patent: Sep. 29, 1987

[54] PROCESS FOR APPLYING AN ELECTRICALLY CONDUCTING POLYMER TO A SUBSTRATE

[75] Inventors: Louis Maus, Camarillo; Edward F. Witucki, Van Nuys; Leslie F. Warren, Camarillo, all of Calif.

[73] Assignee: Rockwell International Corporation, El Segundo, Calif.

[21] Appl. No.: 883,260

[22] Filed: Jul. 8, 1986

Related U.S. Application Data

[63] Continuation-in-part of Ser. No. 646,717, Sep. 4, 1984, Pat. No. 4,617,228.

[51] Int. Cl.$^4$ .......................... B05D 3/02; B05D 5/12
[52] U.S. Cl. .................................... 427/121; 252/500; 427/255.6; 427/299; 427/322; 427/385.5; 427/389.8; 427/389.9; 528/423
[58] Field of Search ..................... 252/500; 427/255.6, 427/299, 322, 385.5, 389.8, 389.9, 121; 528/423

[56] References Cited

U.S. PATENT DOCUMENTS 4,521,450  6/1985  Bjorklund et al. ........... 427/255.6 X
4,567,250  1/1986  Naarmann et al. ............. 252/518 X

OTHER PUBLICATIONS

"Chemical Oxidative Polymerization as a Synthetic Route to Electrically Conducting Polypyrroles", Ronald E. Myers, Journal of Electronic Materials, vol. 15, No. 2, pp. 61–69, Mar. 1986.

*Primary Examiner*—Michael R. Lusignan
*Attorney, Agent, or Firm*—Charles T. Silberberg; Max Geldin

[57] ABSTRACT

Production of electrically conductive composite or structural materials comprising a dielectric substrate, e.g. fiberglass fabric, and a layer of a pyrrole polymer on the substrate, by treating the substrate with a solution of a strong oxidant containing a substantially non-nucleophilic anion, e.g. ferric chloride, drying the substrate and exposing the so treated substrate with the vapors of a pyrrole and oxidizing the pyrrole by the strong oxidant and depositing a polypyrrole layer or film on the substrate.

24 Claims, No Drawings

PROCESS FOR APPLYING AN ELECTRICALLY CONDUCTING POLYMER TO A SUBSTRATE

This application is a continuation-in-part of U.S. application Ser. No. 646,717, filed Sept. 4, 1984 now U.S. Pat. No. 4,617,228, of Paul R. Newman, Leslie F. Warren, Jr. and Edward F. Witucki.

BACKGROUND OF THE INVENTION

The present invention relates to the production of electrically conductive polypyrrole, and is particularly concerned with a novel chemical process for applying a conductive polypyrrole layer or film on a suitable substrate, for production of conductive composites or structural materials.

Polypyrrole represents one of the most environmentally stable conducting organic polymers. Its usual preparation has involved electrochemical oxidation of pyrroles in various solvents, with films of the conducting materials depositing on the anode. Thus, free-standing polypyrrole films from about 10 μm to 20 mil thick have been produced on electrodes by electrochemical polymerization. However, these prior art films are too thin and too brittle to be useful in most structurally related applications.

U.S. Pat. No. 4,552,927 to L. F. Warren discloses a conductive polypyrrole which can be produced in thicker layers and has increased mechanical flexibility as compared to prior art polypyrrole film, obtained by electropolymerizing pyrrole from an electrolyte containing a non-nucleophilic polymeric anion, such as polystyrenesulfonate, and pyrrole.

U.S. Pat. No. 4,582,575 to L. F. Warren, D. S. Klivans and L. Maus, discloses an electrically conductive composite comprising a dielectric porous substance, such as fiberglass fabric, and an electrically conductive pyrrole polymer deposited in the pores of such substance, by contacting such porous substance with an anode in an electrolytic cell containing an electrolyte comprising a pyrrole monomer and a substantially non-nucleophilic anion, such as sulfate, and electrochemically depositing a conductive pyrrole polymer in the pores of such substance.

U.S. application Ser. No. 646,717, filed Sept. 4, 1984, of P. R. Newman, L. F. Warren, Jr. and E. F. Witucki, now U.S. Pat. No. 4,617,228 and assigned to the same assignee as the present application, discloses a chemical process for producing an electrically conductive composite which comprises contacting a dielectric porous substance, such as fiberglass fabric with a liquid pyrrole, then contacting the porous substance with a solution of a strong oxidant capable of oxidizing pyrrole to a pyrrole polymer, such as ferric cation, and oxidizing the pyrrole in the presence of a substantially non-nucleophilic anion, such as sulfate, and precipitating a conductive pyrrole polymer in the pores of such substance.

An object of the present invention is the provision of a novel process for applying a conductive polypyrrole to a substrate to produce electrically conductive composites or structural materials.

Another object of the invention is to provide procedure for applying a conductive polypyrrole layer or film to a dielectric structural material to produce an electrically conductive composite.

SUMMARY OF THE INVENTION

The above objects are achieved, according to the invention, by contacting a dielectric substrate such as a structural material, e.g. fiberglass fabric, with a solution of a strong oxidant, such as ferric ion, in the presence of a substantially non-nucleophilic anion, such as chloride ion, e.g. as provided by ferric chloride. The so treated substrate is then allowed to dry, and the dry material is then exposed to the vapors of a pyrrole, e.g. neat pyrrole or a pyrrole derivative, or of a solution of a pyrrole. The pyrrole is thus oxidized and results in formation of an insoluble deposit of polypyrrole, in the form of a layer or film, which is electrically conductive, on the substrate surface. A stream of gaseous $N_2$ can be used to increase the rate of reaction. The conductive substrate can be rinsed, if desired, to remove any unreacted oxidizer or by-products such as $FeCl_2$.

The electrical conductivity of the resulting composite can be controlled by regulating the amount of oxidant and pyrrole applied to the substrate, or by carrying out successive oxidizer/pyrrole vapor treatment cycles (successive cycles increase conductivity), until the desired conductivity has been attained, or by varying the pyrrole/substituted pyrrole ratio in the vapor phase, where mixtures of pyrroles are employed. Thus, a dielectric substrate or electrically insulating structural material such as fiberglass fabric can be rendered conductive to varying degrees according to the present invention.

These and other objects and features of the invention will become apparent from the following detailed description thereof.

DETAILED DESCRIPTION OF THE INVENTION AND PREFERRED EMBODIMENTS

According to a preferred embodiment of the invention, a structural material, which is a dielectric or electrically insulating material, is dipped or immersed in a solution containing a strong oxidant and including a non-nucleophilic anion, such as $Fe^{3+}$ and $Cl^-$, respectively, derived from ferric chloride. After drying, the structural material containing the oxidant material, e.g. ferric chloride, is suspended above the surface of a liquid pyrrole or pyrrole solution, or a mixture of pyrrole and a substituted derivative thereof, such as an N-substituted pyrrole. This results in the oxidation of the pyrrole and the chemical deposition of a polypyrrole, or a copolymer of pyrrole and a substituted derivative thereof. A dark layer or film of conductive polypyrrole thus forms in a period of minutes on the substrate.

The electrically conductive polymer thus deposited as a layer or film on the substrate comprises a cationic polypyrrole portion and an anionic portion derived from the non-nucleophilic anion, e.g., chloride.

In carrying out the invention process, porous or non-porous dielectrics or electrically insulating structural materials can be used, such as a ceramic, a porous or non-porous glass, e.g., a frit, a porous or non-porous reticulated organic foam, e.g., polyurethane, a fabric, a mixed oxide fabric such as an alumina/silica/boria fabric, e.g., Nextel, or a synthetic organic fabric such as Kevlar, a trademark of the DuPont Company for aromatic polyamide fiber, a polyester such as Dacron cloth or Mylar, a polyimide such as Kapton, or a nylon-based material such as Wrightlon. Also, the honeycomb core material known as "Nomex Core," understood to be an aramid paper bonded and overcoated with a heat resistant phenolic resin, can be employed as substrate. The insulating substrate material can vary in thickness. An insulating substrate such as fiberglass fabric, can have a thickness, e.g. ranging from about 1 to about 20 mils.

The substrate is treated as by dipping or immersing same into a solution of a strong oxidant. The oxidant solution alternatively can be applied to the substrate by means of a liquid dispenser, as by spraying or brushing. The term "strong oxidant" as employed here is intended to denote any oxidizing substance which is capable of oxidizing pyrrole or a substituted derivative thereof as defined above, to produce polypyrrole or a pyrrole copolymer.

Examples of strong oxidants include the cations $Fe^{3+}$, $Cu^{2+}$, $Ce^{4+}$, $NO^+$, $NO_2^+$ and $(C_6H_5)_3C^+$. Examples of compounds providing the above cations as oxidizing agents are the soluble salts of the above cations such as ferric perchlorate, ferric chloride, cupric fluoborate, cupric perchlorate, nitrosyl hexafluorophosphate, triphenylmethyl fluoborate, ceric sulfate, and the like.

Other suitable oxidizing agents such as an anion, e.g., the persulfate anion, halogens, oxygen, permanganate and dichromate in acidic media, can be employed.

Further, instead of employing oxidants in the form of cations or anions, neutral oxidants such as hydrogen peroxide in an acid solution, e.g., in dilute sulfuric acid, can be employed.

A material providing substantially non-nucleophilic anions functioning as dopant for the pyrrole polymer is also employed, preferably in conjunction with the oxidant. These anions are generally strong acid anions such as sulfate, bisulfate, perchlorate, fluoborate, $PF_6^-$, $AsF_6^-$ and $SbF_6^-$ anions. Chloride anion also can be used, even though it is somewhat nucleophilic.

Examples of compounds providing such anions are the free acids and the soluble salts of such acids, e.g., the alkali metal salts. Examples of such compounds include sulfuric acid, sodium sulfate, sodium bisulfate, sodium perchlorate, ammonium fluoborate, hydrogen hexafluoroarsenate, and the like. In addition, the non-nucleophilic anion can be a sulfonate salt or sulfonic acid anion derived from an organic sulfonate or an organic sulfonic acid, e.g., as provided by p-toluenesulfonate and polymeric sulfonates, e.g., polystyrenesulfonate and polyvinylsulfonate, and trifluoromethylsulfonate, $CF_3SO_3^-$. Also, organic sulfate anions such as dodecylsulfate can be employed.

Although the oxidant as cation and the non-nucleophilic anion can be provided by separate compounds, a convenient manner for providing both the strong oxidant and non-nucleophilic anion is in the form of a salt incorporating both the oxidant cation and the non-nucleophilic anion, as exemplified by the above-noted compounds ferric perchlorate, ferric chloride, cupric fluoborate, cupric perchlorate, and the nitrosyl and triphenylmethyl salts, e.g. nitrosyl hexafluorophosphate ($NOPF_6$), and also alkyl and aryl sulfonates, e.g. ferric ethylbenzenesulfonate and ferric dodecylbenzenesulfonate. When ferric chloride is used, the non-nucleophilic anions present include $FeCl_4^-$ and $FeCl_4^{2-}$, as well as chloride ion.

The oxidant which preferably also incorporates the non-nucleophilic anion, e.g., as in ferric chloride, can be dissolved in water to form an aqueous solution, or such oxidant can be dissolved in an organic solvent, dependent on its ability to dissolve the particular oxidant salt and its inertness with respect to such oxidant salt. Where separate compounds providing the oxidant and non-nucleophilic anion are provided, such solvent should be capable of suitably dissolving both compounds.

Examples of suitable solvents include alcohols, acetone, acetonitrile, tetrahydrofuran and methylene chloride. Thus, for example, the above-noted ferric salts can be dissolved in acetone, acetonitrile or tetrahydrofuran. The triphenylmethyl salts are best employed in methylene chloride. The ferric or ceric salts can also be employed in aqueous solution.

Although in preferred practice the non-nucleophilic anion or anion producing material is present in the oxidant solution, if desired, such anion or anion producing material can be provided in a solution separate from the oxidant solution.

The concentration of oxidant material or cation in aqueous or solvent solution can range from about 0.001 to about 2 molar, preferably about 0.5 molar, and the concentration of non-nucleophilic anion or anion producing material also can range from about 0.001 to about 2 molar, preferably about 0.5 molar.

The liquid pyrrole solution employed to generate pyrrole vapors can comprise neat liquid pyrrole, a C-substituted pyrrole, such as a 3- or 3,4- alkyl or aryl substituted pyrrole, e.g., 3-methylpyrrole, 3,4-dimethylpyrrole, 3-phenylpyrrole or 3-methyl-4-phenylpyrrrole, an N-substituted pyrrole, e.g., an N-alkylpyrrole, such as N-methylpyrrole, or an N-arylpyrrole such as N-phenylpyrrole, or a substituted N-phenylpyrrole such as nitrophenylpyrrole, to obtain the corresponding conductive pyrrole homopolymer. For production of a conductive copolymer, a mixture of pyrrole and a C-or an N-substituted derivative of pyrrole, as described above, can be employed. The use of N-substituted pyrroles results in lower conductivity polymers than the parent polypyrrole. Hence, the use of pyrrole is preferred for higher conductivity applications.

The pyrrole may or may not contain a solvent. The solvents used can be any organic solvent in which pyrrole is soluble, and which does not interfere with the desired oxidation reaction. Such solvents include alcohols, ethers, e.g., dioxane, acetone, acetonitrile, tetrahydrofuran, methylene chloride, and the like. Water, alone or in combination with a water miscible solvent also can be employed. The concentration of the pyrrole in the solvent can vary but generally is in the range from about 0.03 to about 2 molar. Usually, the liquid or neat pyrrole is employed without a solvent.

The treatment of the dielectric substrate in the oxidant solution and the genration of pyrrole vapors for contact with the oxidant-containing substrate is generally carried out in each case at ambient or room temperature. However, such temperature can be higher or lower, for example, the liquid pyrrole or pyrrole solution can be heated at elevated temperature to increase the rate and volume of pyrrole vapors generated. Also, in preferred practice such treatments are carried out in the presence of oxygen or air, or gaseous $N_2$.

After treatment of the substrate in the oxidant solution, excess oxidant solution is permitted to drain from the substrate, and the treated substrate is permitted to dry with the oxidant residue coating the substrate. Such drying can take place at ambient temperature or by warming in a vacuum oven.-

The substrate containing the dried oxidant is then suspended in a zone of pyrrole vapors, as by suspending such substrate over a container of the liquid pyrrole or pyrrole solution.

The time of treatment of the substrate in the pyrrole vapors is long enough to permit reaction of the pyrrole vapors with the oxidant, and the precipitation of polypyrrole to occur, to form a polypyrrole layer or film coating on the substrate. The polypyrrole layer or film is comprised of a pyrrole polymer cation and a substantially non-nucleophilic anion as dopant. Where a porous substrate such as fiberglass is employed, the polypyrrole also impregnates the interstices of the substrate. The oxidation reaction can require several minutes, e.g., about 1 to 5 minutes for completion, or it can be extended over a period of hours, during which time the polypyrrole coating on the substrate darkens as the polymerization reaction proceeds. The rate of the reaction or polypyrrole deposition can be increased by blowing a stream of gaseous $N_2$ over the substrate surface while the substrate is in contact with the pyrrole vapors.

After formation of the polypyrrole coating or film on the substrate, if desired, the coated substrate can be rinsed, e.g. with a suitable solvent such as methanol, to remove reaction by-products.

The substrate coated with pyrrole polymer has an electrical conductivity which can be measured with a standard 2-probe ohmmeter apparatus, and such conductivity generally corresponds to a sheet resistivity ranging from about 20 to about 400,000 ohms/square. The term "ohms/square" as a measure of sheet resistivity is defined as the bulk resistivity of the sample which is expressed in ohms$\times$cm divided by the thickness in cm. Sheet resistivity is proportional to the reciprocal of electrical conductivity.

To increase the conductivity of the material coated with pyrrole polymer, additional or repeated treatments of, for example, a fabric with an oxidant solution followed by treatment with pyrrole vapors, often are required to build up the polymer level in the material. Hence, the conductivity of the polymer coated substrate can be adjusted by the number of such treatments, as well as by varying the concentrations of the oxidant and pyrrole solutions.

The following are examples of practice of the invention, it being understood that such examples are only illustrative and in no sense limitative of the invention.

EXAMPLE I

A small piece of fiberglass cloth 4"$\times$4" was dipped for 5 minutes into a solution of 10 grams of ferric chloride in 100 mls of acetonitrile. After drying, the cloth was suspended about 1 inch above the surface of neat pyrrole contained in a beaker. A dark layer of conductive polypyrrole formed in about 5 minutes. The rate of polypyrrole deposition can be increased with a slight stream of gaseous nitrogen blown over the pyrrole surface. The conductivity of the polypyrrole coated and impregnated fiberglass was 200 ohms/square.

EXAMPLE II

A small piece of Kevlar cloth 4"$\times$4" was dipped for 5 minutes into a solution of 5 grams of NOPF$_6$ in 50 mls of acetonitrile. After drying, the cloth was suspended 1 inch above the surface of neat pyrrole contained in a beaker. A slight stream of gaseous $N_2$ was blown across the surface of the pyrrole. A black layer of conductive polypyrrole formed onto the cloth in 1-5 minutes; its conductivity was 300 ohms/square.

EXAMPLE III

A small piece of honeycomb core (Nomex core HRH-10) was dipped for 5 minutes into a solution of 15 grams of ferric chloride in 200 mls of acetone. After thorough drying, the core was suspended 1 inch above the surface of neat pyrrole contained in a beaker. A slight stream of gaseous nitrogen was blown across the surface of the pyrrole. In 5 minutes a black layer of conducting polypyrrole had formed into the honeycomb core. The conductivity of this material was 450 ohms/square.

EXAMPLE IV

A solution of 0.59 g of ferric dodecylbenzenesulfonate and 0.46 g of ferric chloride hexahydrate was made in 8 ml of absolute ethanol. Five to ten drops of this solution was dripped and allowed to spread onto flat 3"$\times$3" sheets of Mylar, Kapton, or Wrightlon 8400, all of which are cellophane-like film materials. After 20 minutes, during which time most of the solvent had evaporated, the treated films were placed in a closed container containing an open vessel of neat pyrrole. The pyrrole vapor in the container gradually reacted with the ferric salts on the sheets to form black films of polypyrrole on the materials. A 12 hour exposure to the pyrrole vapors was found to give the best films. The samples were then carefully rinsed with methanol to remove reaction by-products. The black polymer films on the insulating substrates were electrically conducting as shown by an ohmmeter (350 ohms/square).

EXAMPLE V

Following the procedure of Example I, using an oxidant solution containing 0.42 g of ferric ethylbenzenesulfonate and 0.43 g of ferric chloride hexahydrate in 8 ml of absolute ethanol produced similar results to those in Example I. One sample exhibited a sheet resistivity of 400 ohms per square.

EXAMPLE VI

A few drops of a concentrated, viscous solution of ferric ethylbenzenesulfonate in isopropanol were dripped and spread into a thin, smooth film on a clean glass microscope slide. The sample was then heated at 70 degrees centigrade for 20 minutes to remove the solvent and exposed to pyrrole vapor as in Example I. After 20 minutes, the smooth, coherent black polypyrrole film formed was electrically conducting, both prior to and after careful rinsing with methanol.

EXAMPLE VII

The procedure of Example I was essentially followed except that in place of neat pyrrole, a mixture of 70 mole % pyrrole and 30 mole % N-methylpyrrole was employed.

In this example, a conductive copolymer of pyrrole and N-methylpyrrole was formed as a layer on the fiberglass fabric, comprised of the pyrrole copolymer cation and chloride and chlorion anions.

EXAMPLE VIII

The procedure of Example I was essentially followed except employing as the oxidant a solution of 0.5 molar cupric perchlorate in acetonitrile.

The resulting dried composite of the fiberglass substrate coated and impregnated with polypyrrole was electrically conductive.

The electrically conductive materials of the invention have application as conductive composite structural materials, in the production of electrodes, batteries, switches, semiconductor components, in anti-static applications, e.g., anti-static finishes for plastics, electromagnetic interference shielding applications and as electrical conductors.

From the foregoing, it is seen that the invention provides a novel procedure for chemical deposition of a conducting pyrrole polymer layer or film on a porous or non-porous dielectric material or substrate so as to confer varying degrees of electrical conductivity upon the structural material.

Since various changes and mofications of the invention will occur to and can be made readily by those skilled in the art without departing from the invention concept, the invention is not to be taken as limited except by the scope of the appended claims.

What is claimed is:

1. A process for producing an electrically conductive composite which comprises:
   (a) contacting a dielectric substrate with a solution of a strong oxidant capable of oxidizing a pyrrole to a pyrrole polymer,
   (b) drying said substrate, and
   (c) contacting the so treated substrate with the vapors of a pyrrole and oxidizing said pyrrole by said strong oxidant in the presence of a substantially non-nucleophilic anion, and depositing polypyrrole on said substrate.

2. The process of claim 1, said contacting step (a) being carried out by immersion of said dielectric substrate in said oxidant solution and said contacting step (c) being carried out by exposing said substrate containing said strong oxidant to the vapors of a liquid pyrrole or a solution thereof.

3. The process of claim 1, including carrying out a plurality of treatments of said dielectric substrate with said strong oxidant and said pyrrole vapors.

4. The process of claim 1, said strong oxidant being a cation selected from the group consisting of $Fe^{3+}$, $Cu^{2+}$, $Ce^{4+}$, $NO^+$, $ON_2^+$ and $(C_6H_5)_3C^+$ cations.

5. The process of claim 1, said pyrrole selected from the group consisting of pyrrole, a 3- and 3,4-alkyl and aryl C-substituted pyrrole, an N-alkylpyrrole and an N-arylpyrrole.

6. The process of claim 1, said non-nucleophilic anion being selected from the group consisting of sulfate, bisulfate, perchlorate, chloride, fluoborate, $PF_6^-$, $AsF_6^-$, and $SbF_6^-$ anions.

7. The process of claim 6, said non-nucleophilic anion being derived from the free acids or the soluble salts of said acids.

8. The process of claim 1, said non-nucleophilic anion being present in the solution of said strong oxidant.

9. The process of claim 8, said oxidant and said non-nucleophilic anion being provided by a compound selected from the group consisting of ferric perchlorate, ferric chloride, ceric sulfate, cupric fluoborate, cupric perchlorate, nitrosyl hexafluorophosphate, ferric ethylbenzenesulfonate and ferric dodecylbenzenesulfonate.

10. The process of claim 1, said solution of said strong oxidant being an aqueous solution or an organic solvent solution of said oxidant including an organic solvent which is inert with respect to said oxidant and permitting said oxidant to oxidize said pyrrole.

11. The process of claim 2, said pyrrole being a neat pyrrole.

12. The process of claim 2, said pyrrole being present in aqueous or organic solvent medium in which said pyrrole is soluble and which does not interfere with the oxidation reaction.

13. The process of claim 8, said oxidant being present in the range of about 0.001 to about 2 molar, and said non-nucleophilic anion being present in a concentration in the range from about 0.001 to about 2 molar.

14. The process of claim 1, said dielectric substrate selected from the group consisting of a ceramic, glass, an organic foam, and a fabric.

15. The process of claim 14, said substrate being a fabric selected from the group consisting of fiberglass fabric, mixed oxide fabric and a synthetic organic fabric.

16. The process of claim 15, said substrate being fiberglass fabric.

17. A process for producing an electrically conductive composite which comprises:
   (a) dipping a dielectric substance in a solution of a strong oxidant capable of oxidizing a pyrrole to a pyrrole polymer, and a substantially non-nucleophilic anion,
   (b) drying said substance containing said strong oxidant and non-nucleophilic anion, and
   (c) exposing the dried substance to the vapors of a pyrrole generated by a liquid pyrrole, and oxidizing said pyrrole by said strong oxidant in the presence of said substantially non-nucleophilic anion, and depositing polypyrrole in the form of a layer or film on said substance.

18. The process of claim 17, said pyrrole selected from the group consisting of pyrrole, a 3- and 3,4-alkyl and aryl C-substituted pyrrole, an N-alkylpyrrole and an N-arylpyrrole, said strong oxidant being a cation selected from the group consisting of $Fe^{3+}$, $Cu^{2+}$, $Ce^{4+}$, $NO^+$, $NO_2^+$ and $(C_6H_5)_3C^+$ cations, and said non-nucleophilic anion being selected from the group consisting of sulfate, bisulfate, perchlorate, chloride, fluoborate, $PF_6^-$, $AsF_6^-$ and $SbF_6^-$ anions.

19. The process of claim 18, said oxidant and said non-nucleophilic anion being provided by a compound selected from the group consisting of ferric perchlorate, ferric chloride, ceric sulfate, cupric fluoborate, cupric perchlorate, nitrosyl hexafluorophosphate, ferric ethylbenzenesulfonate and ferric dodecylbenzenesulfonate.

20. The process of claim 18, said oxidant being present in the range of about 0.001 to about 2 molar, and said non-nucleophilic anion being present in a concentration in the range from about 0.001 to about 2 molar.

21. The process of claim 20, said substance being a fabric selected from the group consisting of fiberglass fabric, mixed oxide fabric and a synthetic organic fabric.

22. The process of claim 21, said substance being fiberglass fabric.

23. The process of claim 1, wherein said dielectric substrate is a non-porous substrate.

24. The process of claim 17, wherein said dielectric substance is a non-porous substance.

* * * * *

UNITED STATES PATENT AND TRADEMARK OFFICE
CERTIFICATE OF CORRECTION

PATENT NO. : 4,696,835
DATED : September 29, 1987
INVENTOR(S) : Louis Maus, Edward F. Witucki, and Leslie F. Warren It is certified that error appears in the above-identified patent and that said Letters Patent is hereby corrected as shown below:

Claim 4, line 3, delete "$ON_2+$" and substitute therefor ---$NO_2+$---.

Signed and Sealed this

Eighth Day of March, 1988

Attest:

DONALD J. QUIGG

Attesting Officer

Commissioner of Patents and Trademarks